United States Patent
Yasuda et al.

(10) Patent No.: US 9,362,943 B2
(45) Date of Patent: Jun. 7, 2016

(54) CONVERTER

(71) Applicant: Trigence Semiconductor, Inc., Tokyo (JP)

(72) Inventors: Akira Yasuda, Tokyo (JP); Jun-ichi Okamura, Tokyo (JP)

(73) Assignee: TRIGENCE SEMICONDUCTOR, INC., Tokyo (JP)

( * ) Notice: Subject to any disclaimer, the term of this patent is extended or adjusted under 35 U.S.C. 154(b) by 0 days.

(21) Appl. No.: 14/695,385

(22) Filed: Apr. 24, 2015

(65) Prior Publication Data

US 2015/0236713 A1 Aug. 20, 2015

Related U.S. Application Data

(63) Continuation of application No. PCT/JP2013/078998, filed on Oct. 25, 2013.

(30) Foreign Application Priority Data

Oct. 25, 2012 (JP) .................................. 2012-235910

(51) Int. Cl.
  *H03M 1/00* (2006.01)
  *H03M 3/00* (2006.01)

(52) U.S. Cl.
  CPC .............. *H03M 3/322* (2013.01); *H03M 3/496* (2013.01); *H03M 3/50* (2013.01)

(58) Field of Classification Search
  CPC ......... H03M 1/00; H03M 3/458; H03M 3/43; H03M 3/456; H03M 1/12; H03M 3/424; H03M 3/04; H03M 3/506; H03M 3/02; H03M 3/50; H03M 7/00; H03M 7/3022; H03M 3/30

USPC ............................................ 341/155, 143, 122
  See application file for complete search history.

(56) References Cited

U.S. PATENT DOCUMENTS

| | | | | |
|---|---|---|---|---|
| 5,471,209 A | * | 11/1995 | Sutterlin et al. | 341/143 |
| 2010/0225517 A1 | * | 9/2010 | Aiba | 341/143 |
| 2011/0069211 A1 | | 3/2011 | Jung et al. | |

FOREIGN PATENT DOCUMENTS

| JP | 2007-243504 A | 9/2007 |
|---|---|---|
| JP | 2011-071988 A | 4/2011 |

OTHER PUBLICATIONS

Keith B. Hardin et al., Spread Spectrum Clock Generation for the Reduction of Radiated Emissions, IEEE International Symposium on Electromagnetic Compatibility, 1994, pp. 227-231.
English Translation of International Search Report issued on Jan. 28, 2014 regarding PCT application No. PCT/JP2013/078998.

\* cited by examiner

*Primary Examiner* — Jean B Jeanglaude
(74) *Attorney, Agent, or Firm* — Typha IP LLC

(57) ABSTRACT

Provided is a data converter which is provided with a clock signal input part which inputs a clock signal, and an input part which inputs an input signal, a sampling part which, in response to the clock signal input to the clock signal input part, performs sampling of the input signal input to the input part, and a signal processing part which performs signal processing according to the sampling cycle and outputs an output signal, wherein when the cycle of the clock signal input to the clock signal input part becomes longer, the output signals output by the signal processing part are reduced.

20 Claims, 17 Drawing Sheets

(a)

(b)

CONVERTER

CROSS-REFERENCE TO RELATED APPLICATIONS

This application is a U.S. continuation application filed under 35 USC 111(a) claiming benefit under 35 USC 120 and 365(c) of PCT application JP2013/078998, filed on Oct. 25, 2013, which claims priority to Japanese Patent Application No. 2012-235910 filed on Oct. 25, 2012, the entire contents of the foregoing application being incorporated herein by reference.

BACKGROUND OF THE INVENTION

1. Field of the Invention

The present invention is related to a converter which converts an analog signal to a digital signal (an analog-digital converter), and a converter which converts a digital signal to an analog signal (a digital-analog converter). In particular, the present invention is related to an analog-digital converter and a digital-analog converter, each of which uses a $\Delta\Sigma$ modulator.

2. Description of the Related Art

As a method for realizing a high accuracy analog-digital converter and a high accuracy digital-analog converter, a method to use a $\Delta\Sigma$ modulator as shown in FIG. 1 for example is used. In such a method to use a $\Delta\Sigma$ modulator, quantization of an input signal passed through a loop filter is once performed at a lower resolution than the precision finally required and the result is fed back to the input. In addition, over-sampling is performed at a sampling frequency higher than the sampling frequency finally required. By performing the feedback process described above at a high sampling frequency which is for over-sampling, the frequency distribution of quantization noise caused by quantization of the low resolution is controlled and noise in the signal band is reduced. This method is called noise shaping. Even in the case where a low resolution quantizer is used, it is possible to obtain high conversion accuracy by noise shaping. Noise within the signal band can be reduced by increasing a ratio (an oversampling ratio) of the sampling frequency finally required and the sampling frequency by performing over-sampling.

Therefore, in the case of obtaining high conversion accuracy or a high signal-to-noise ratio (SNR), it is necessary to increase the oversampling ratio. For example, it is necessary to increase sampling frequency of the oversampling by 100 times the output sampling frequency.

As a result, however, since the clock frequency is increased, the clock frequency component, the high range noise component which has been noise shaped, and the harmonic component of the signal which has been further sampled (image signal) are radiated as an electromagnetic wave, and a problem arises whereby unnecessary radiation is transmitted to other circuits via wires such as a power supply and adversely affects other circuits and equipment.

As a means for solving this problem, there is a method to apply modulation to a clock signal of an analog-digital converter or a digital-analog converter as shown in FIG. 2.

In the case where this method is used in a converter such as a $\Delta\Sigma$ modulator, however, a problem arises whereby conversion accuracy is significantly degraded. That is, in the case where a clock frequency is varied, low frequency noise is greatly increased and the conversion accuracy is deteriorated.

SUMMARY OF THE INVENTION

As described above, in the conventional method, there is a trade-off between conversion accuracy and unnecessary radiation. Therefore, in order to reduce unnecessary radiation, it is necessary to sacrifice conversion accuracy, and unnecessary radiation increases in order to obtain high conversion accuracy.

The present invention aims to improve this problem by providing an analog-digital converter, a digital-analog converter, a digital direct drive system and a digital direct drive speaker, which significantly reduces unwanted radiation while maintaining conversion accuracy.

As one embodiment of the present invention, a data converter including a clock signal input part which inputs a clock signal, an input part which inputs an input signal, a sampling part which performs sampling of the input signal input to the input part in response to the clock signal input to the clock signal input part, and a signal processing part which performs signal processing in accordance with a sampling cycle and outputs an output signal, wherein when the cycle of the clock signal input to the clock signal input part becomes longer, the output signals output by the signal processing part are reduced is provided.

As one embodiment of the present invention, a data converter including a clock signal input part which inputs a clock signal having a cycle which dynamically changes, an input part which inputs an input signal, a cycle detection part which detects a cycle of a clock signal input to the clock signal input part, and a signal processing part which performs signal processing of an input signal input to the input part according to a cycle of a clock signal detected by the cycle detection part and outputs an output signal is provided.

As one embodiment of the present invention, a data converter including an input part which inputs an input signal, an integrator which integrates a signal output by the input part, a quantizer which quantizes a signal output by the integrator, and a sampler which samples an output of the quantizer in response to a clock signal having a variable cycle, wherein the input part includes a subtractor for performing a subtraction process of an output of the sampler from an input signal and outputs is provided.

As one embodiment of the present invention, a data converter including an input part which inputs an input signal, a loop filter input with a signal output by the input part, a quantizer which quantizes a signal output by the loop filter, and a sample which sampler an output of the quantizer according to a clock signal having a variable cycle, wherein the input part includes a subtractor for performing a subtraction process of an output of the sampler from the input signal and for performing outputting is provided.

As one embodiment of the present invention, a data converter including a clock signal input part which inputs a clock signal, an input part which inputs an input signal, a sampling part which samples an input signal input to the input part in response to a clock signal input to the clock signal input part, a signal processing part which performs signal processing according to a cycle of the sampling and outputs an output signal, and a driver which drives an actuator according to an output signal output by the signal processing part, wherein when a cycle of a clock signal input to the clock signal input part becomes longer, an output signal output by the signal processing part is reduced is provided.

DETAILED DESCRIPTION OF THE INVENTION

Embodiments for carrying out the present invention are explained in detail below in various forms with reference to the drawings. The present invention should not be limited to these embodiments, and may be implemented by carrying out various modifications without departing from the scope and spirit thereof.

Figure 1:
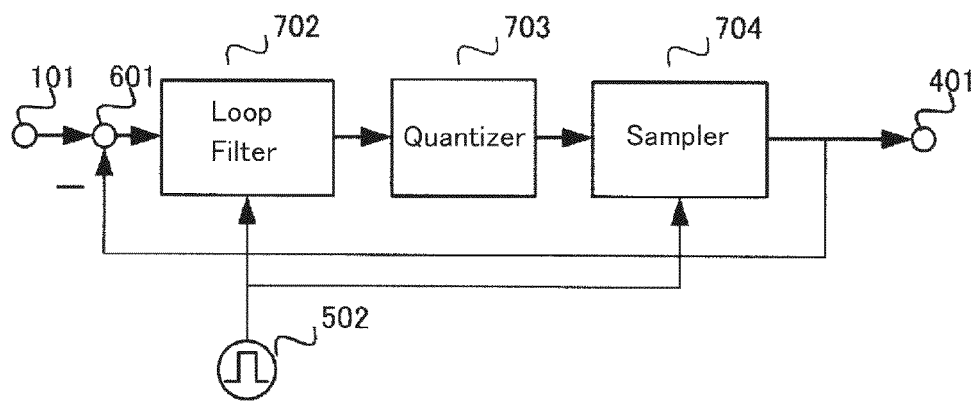
FIG. 1 is a structural diagram of a digital-analog converter.
Figure 2:
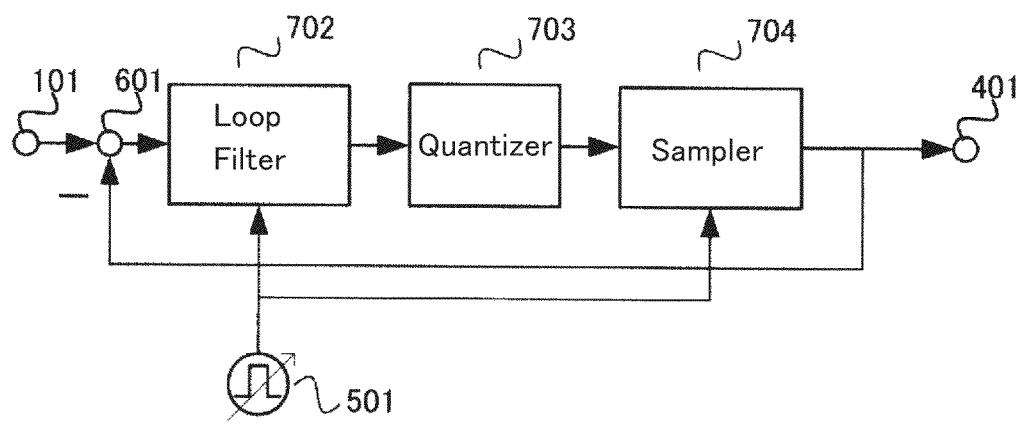
FIG. 2 is a structural diagram of a digital-analog converter which uses a clock modulation.
Figure 3:
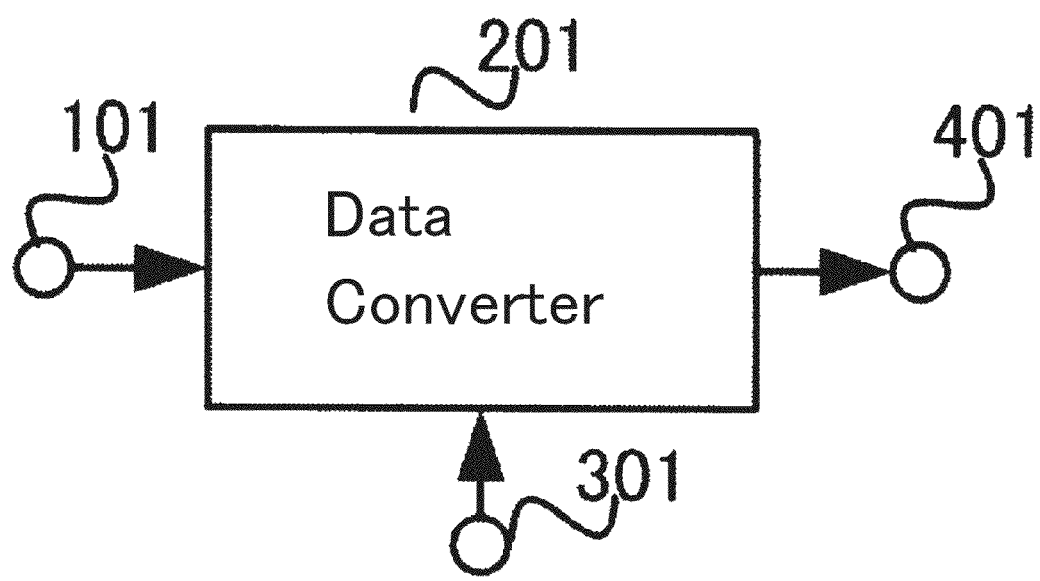
FIG. 3 is a structural diagram of a data converter related to a first embodiment of the present invention.

The first embodiment of the present invention is explained with reference to FIG. 3.

Sampling using a sampling means within a sampling data converter (201) is performed by synchronizing an input signal that is input to an input means (101) with a clock signal input to a clock signal input means (301) and signal processing is performed by a signal processing means in accordance with a cycle of the sampling. In the case where a digital signal is converted to analog, when the cycle of the sampling changes, the timing of an output signal is changed by variation of a cycle of a clock frequency. For example, in the case where the cycle of the clock is long, the pulse width of the output signal becomes wider, and it becomes equivalent to the output signal becoming large. In this way, it is possible to diffuse a spectrum of the output signal and to reduce a peak value of the spectrum at a particular frequency.

Generally, however, by changing the timing of the output, the spectrum of the signal component is also diffused, and a signal that is different from the original characteristics is output. For this reason, the accuracy of the signal is significantly lost.

In order to reduce this effect, correction by making a signal output by internal signal processing smaller is one of the features of the present embodiment. By doing so, it is possible to reduce the effect of the cycle of the clock signal, thereby realizing highly accurate conversion and conversion output can be obtained from the output means (401).

In the conventional method, in the case where the clock cycle is dynamically changed, it is equivalent to sampling a signal using a clock signal with a jitter and the signal-to-noise ratio (SNR) deteriorates significantly.

As a data converter (201) in the present embodiment, it is possible to configure, various converters such as an analog-digital converter, a digital-analog converter, an oversampling type analog-digital converter, an oversampling type oversampling type, a $\Delta\Sigma$ modulator, a $\Delta\Sigma$ type digital-analog converter, and a $\Delta\Sigma$ analog-digital converter.

Figure 4:
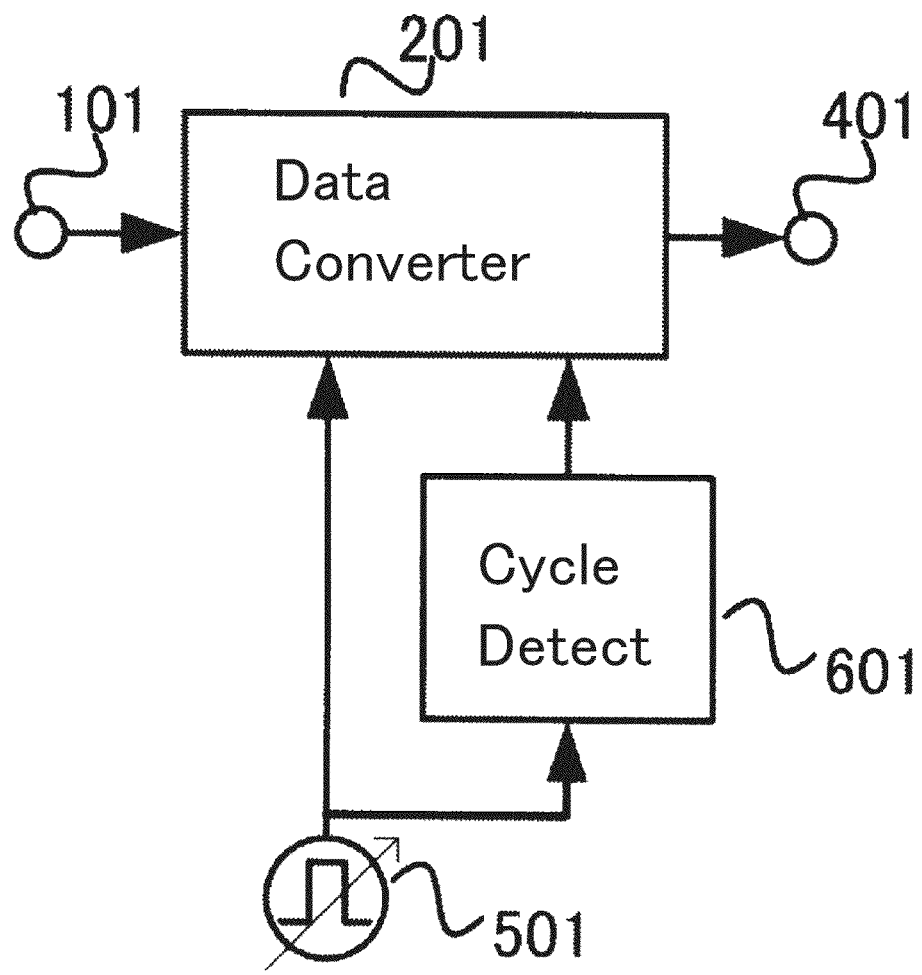
FIG. 4 is a structural diagram of a data converter related to a second embodiment of the present invention.

A second embodiment of the present invention is explained with reference to FIG. 4. In the present embodiment, a clock signal generator (501) which has a cycle changed dynamically is connected to a clock input means (301) of a data converter (201), the clock signal generator (501) is connected to a cycle detection means (601) and the cycle detecting means (601) detects a cycle of an input clock signal. The output of the cycle detecting means (601) is connected to the data converter (201) and a signal processing part of the data converter (201) performs signal processing according to the output of the cycle detection means (601).

In this way, it is possible to diffuse a spectrum of an output signal without degrading the accuracy of the output signal and reduce a peak value of the spectrum at a particular frequency.

Figure 5:
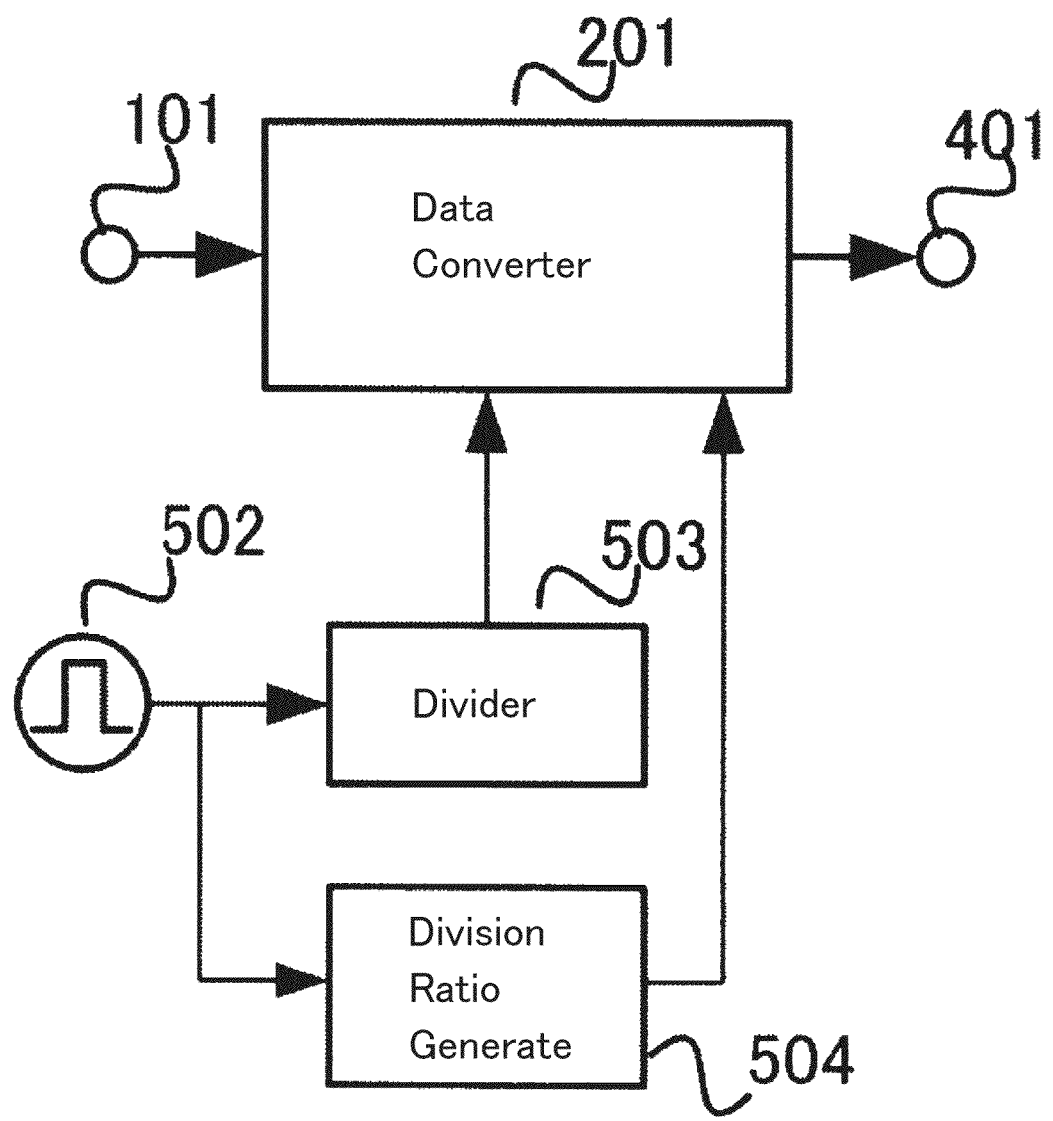
FIG. 5 is a structural diagram of a data converter related to a third embodiment of the present invention.

A third embodiment of the present invention is explained with reference to FIG. 5. The present embodiment uses a clock generation circuit in which a cycle varies dynamically. As shown in FIG. 5, a clock generation part is formed by a clock signal generating means (502), a division means (503) and a division ratio generating means (504). The division means (503) divides the clock signal generating means (502) in accordance with a signal of the division ratio generating means (504). The division ratio generating means (504) can dynamically vary a division ratio. In this way, it is possible to output a signal which has a cycle dynamically changed from the division means (504) and to output a signal corresponding to the cycle of an output of the division means (504) from the division ratio generating means (504). By connecting these signals to the data converter (201), it is possible to perform signal processing in accordance with the clock cycle by the data converter (201).

In this way, it is possible to diffuse a spectrum of an output signal without degrading the accuracy of the output signal and reduce a peak value of the spectrum at a particular frequency.

Figure 6:
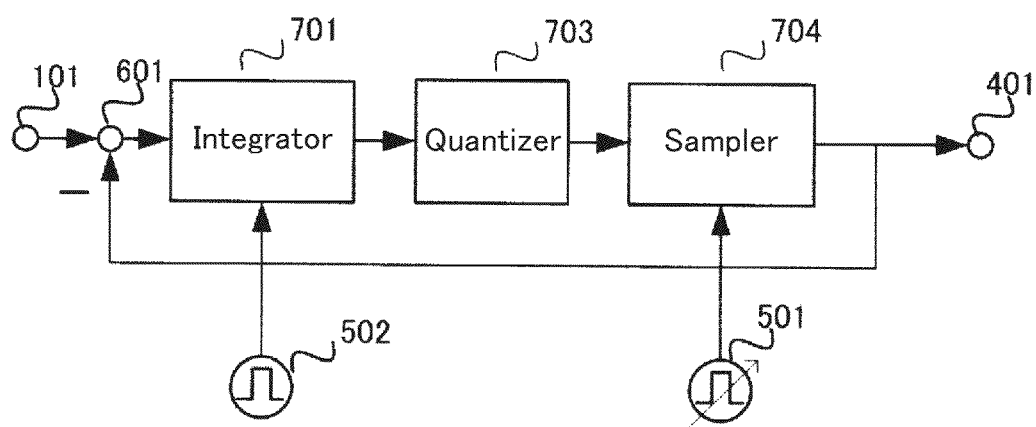
FIG. 6 is a structural diagram of a data converter related to a fourth embodiment of the present invention.

A fourth embodiment of the present invention is explained with reference to FIG. 6. In the present embodiment, a data converter (201) is formed from an integrating means (701), a subtracting means (601), a quantization means (703), and a sampling means (704). The output of the sampling means (704) is subtracted by the subtraction means (601) from an input signal, and this signal is integrated by the integration means (701) and quantized by the quantization means (703). The quantized signal is sampled by the sampling means (704). The quantization and sampling can also be configured using the same means as a comparator circuit etc.

The sampling means (704) performs sampling in response to the clock signal of a variable cycle clock signal generator (501). Therefore, in the case where the cycle of the clock signal becomes longer, the time period for holding the output signal also becomes longer. On the other hand, the signal obtained by subtracting the output of the sampling means (704) by the subtraction means (601) from the input signal is integrated by the integration means (701). Therefore, the output signal of the subtraction means (601) is time-integrated corresponding to the cycle of the variable cycle clock signal generator (501).

Therefore, by using such a configuration, signal processing according to the cycle of the clock signal is possible.

In other words, an output of the sampling means (704) in which a sampling period varies is fed back. In this way, while in the conventional method the accuracy of the output signal is degraded when the clock cycle is changed, it is possible to significantly reduce such effects.

In this way, it is possible to diffuse a spectrum of an output signal without degrading the accuracy of the output signal and reduce a peak value of the spectrum at a particular frequency.

Figure 7:
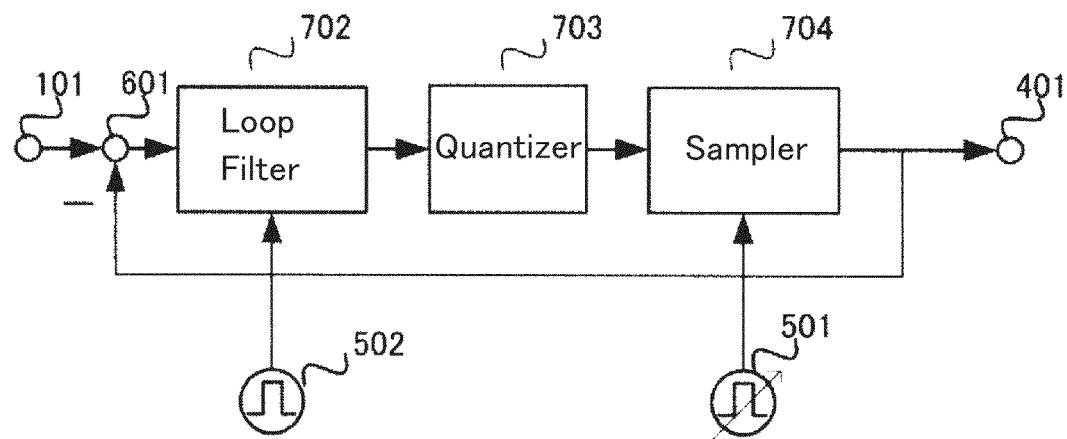
FIG. 7 is a structural diagram of a data converter related to a fifth embodiment of the present invention.

A fifth embodiment of the present invention is explained with reference to FIG. 7. The present embodiment is different in that the integrator in the fourth embodiment is replaced with a loop filter.

Generally, in a ΔΣ modulator, by increasing the order of an integrator used in a loop, it is possible to reduce noise in the band, and improve conversion accuracy. Also in the present invention, it is possible to improve the conversion accuracy by increasing the order of a loop filter. In addition, by using a resonator as a loop filter, it is possible to reduce noise at a particular frequency and realize so-called band-pass conversion characteristics.

Figure 8A:
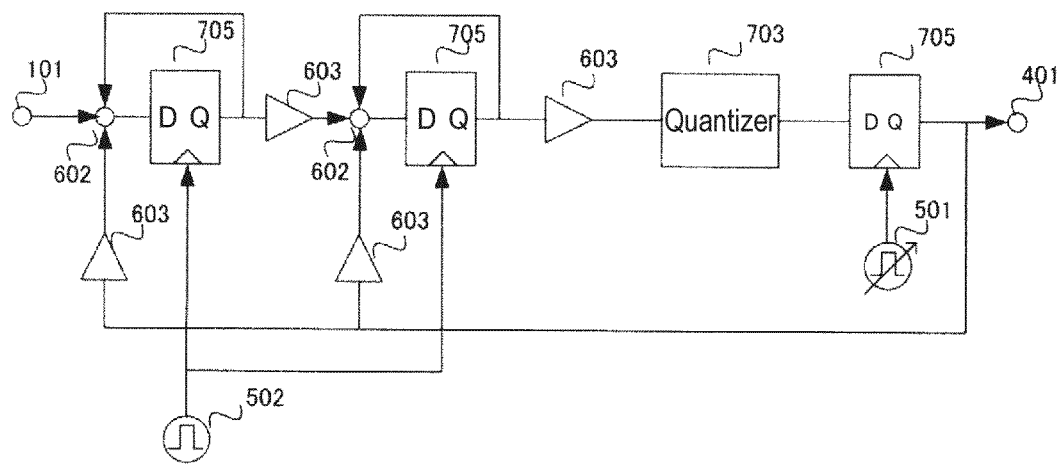
FIG. 8A is a structural diagram of a data converter related to a sixth embodiment of the present invention.

A sixth embodiment of the present invention is explained in more detail with reference to FIG. 8A. An integrator is formed using a flip-flop (705) and an adding means (602) and the output of the integrator is multiplied with a coefficient by a coefficient means (603). In the present embodiment, while the integrators are connected in series in two stages, it is possible to be connected in three stages or more. The output of the integrator at the last stage is quantized by a quantization means (703) and sampled by the flip-flop (705). The clock of the flip-flop determines the sampling timing by a signal from a clock signal generator (501) which has a cycle dynamically changed. On the other hand, a fixed cycle clock signal is supplied to the flip-flop (705), which forms the integrator.

At this time, by shortening the cycle of the clock signal generator (501) compared to the clock cycle of the clock signal generator (502), it is possible to obtain an output of the integrator according to the cycle fluctuation of the clock signal generator (501) and to perform signal processing according to the cycle of the clock signal.

In this way, while in the conventional method the accuracy of the output signal is degraded by a change in the clock cycle, it is possible to significantly reduce such effects.

In particular, by setting the cycle of the clock signal generator (501) and the cycle of the clock signal generator (502) so that they are of an integer ratio, processing according to the cycle of the signal generator (501) without error is possible.

Figure 8B:
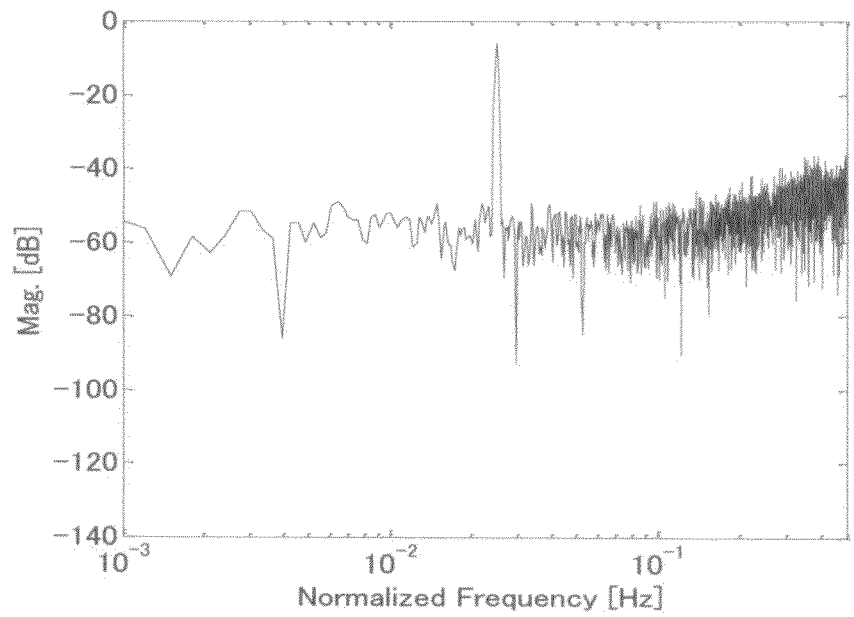
FIG. 8B (a) is a graph showing an output spectrum of a conventional data converter and (b) is a graph showing an output spectrum of a data converter in the sixth embodiment of the present invention.
Figure 8B:
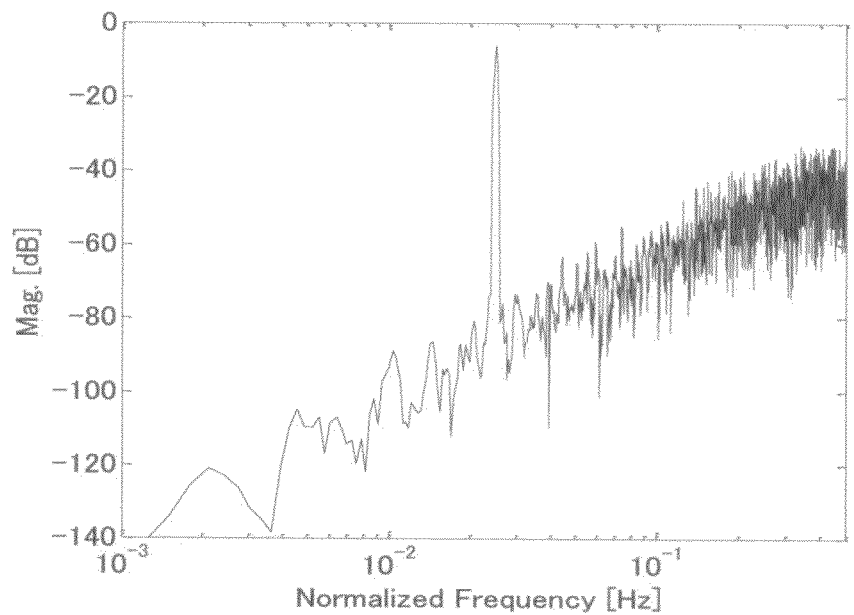

FIG. 8B (a) shows an output spectrum in the case of use of the conventional art and FIG. 8B (b) shows an output spectrum of the present embodiment. As can be seen from these graphs, while low frequency noise is greatly increased in the conventional art wherein a variable clock is used, there is no degradation of the output signal in the case where the present embodiment is used.

Figure 8C:
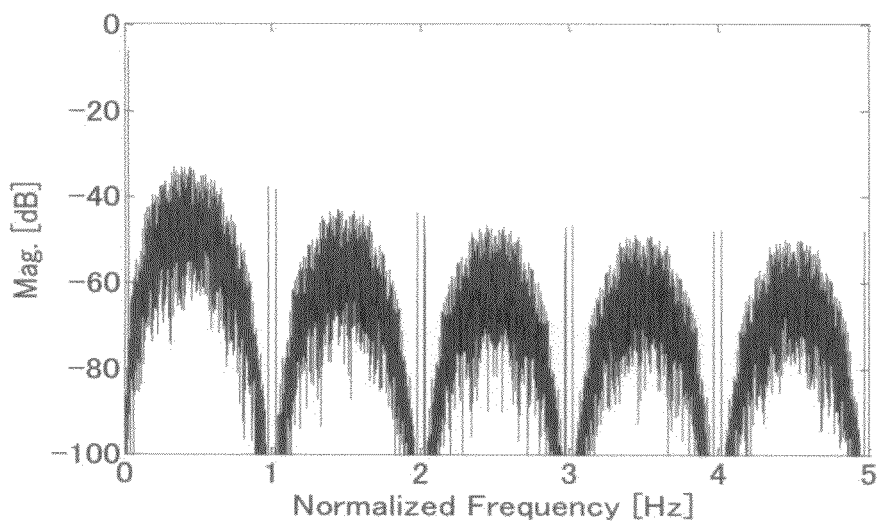
FIG. 8C (a) is a graph showing an output spectrum of a wide band of a conventional data converter and (b) is a graph showing an output spectrum of a wide band of the data converter in the sixth embodiment of the present invention.
Figure 8C:
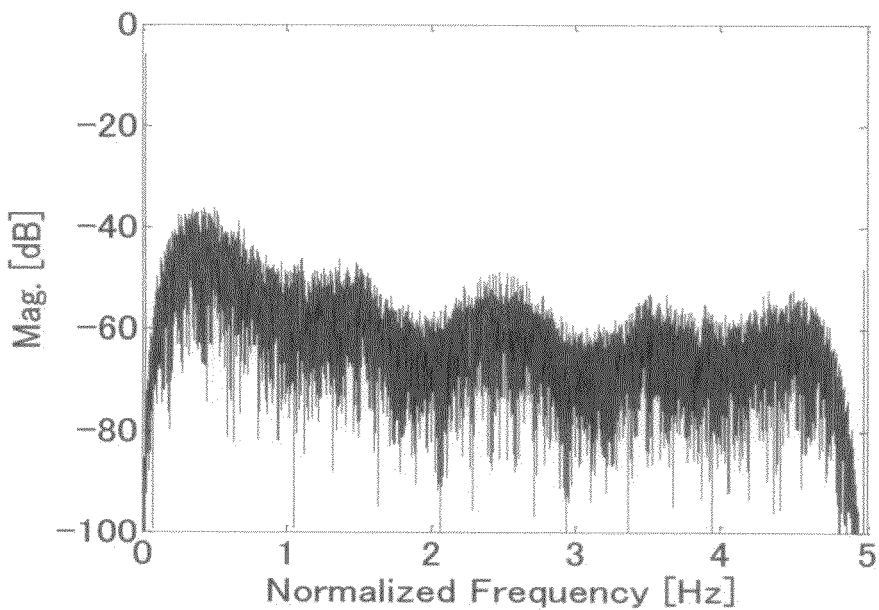

FIG. 8C shows output spectrums in a wide band. FIG. 8C (a) shows an output spectrum in a wide band in a data converter in the conventional art and FIG. 8C (b) shows an output spectrum in a wide band of a data converter of the present embodiment. It can be seen that by using the present embodiment, it is possible to significantly reduce the peak level of the spectrum.

Figure 9:
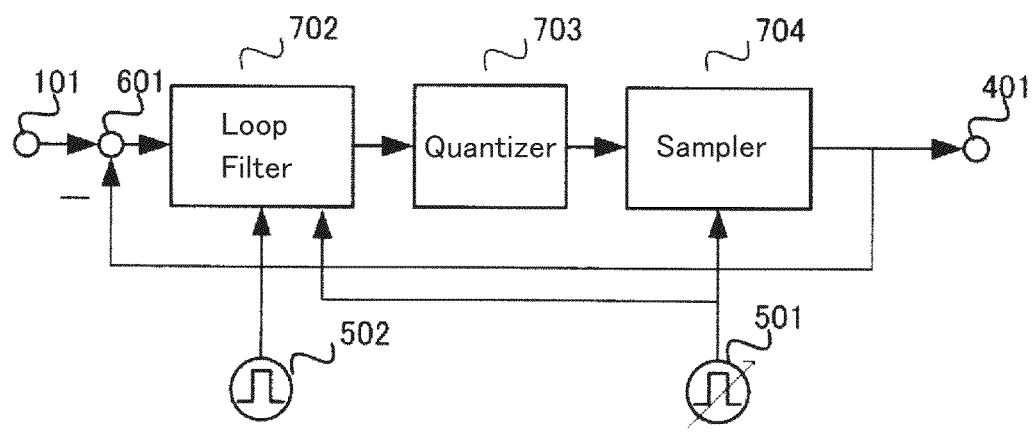
FIG. 9 is a structural diagram of a data converter related to a seventh embodiment of the present invention.

A seventh embodiment of the present invention is explained in detail with reference to FIG. 9. The present embodiment is different to the fifth embodiment shown in FIG. 7 in that a clock signal generating means (501) with a variable cycle is also connected to a loop filter means (702). In the loop filter means (702), the cycle of the clock signal generating means (501) with a variable cycle is detected based on two clock signals from the clock signal generating means (501) with a variable cycle and a fixed cycle clock signal generating means (502), and a coefficient of the loop filter is changed according to this cycle.

By such a configuration, it is possible to obtain an output of the loop filter corresponding to the clock cycle from the clock signal generating means (501) with a variable cycle. While, in the fifth embodiment shown in FIG. 7, it is necessary to shorten the cycle of the clock signal generating means (501) with a fixed cycle compared to the cycle of the clock signal generating means (501) with a variable cycle, in the present embodiment, operation of the loop filter can be performed at a cycle of the clock signal generating means (501) with a variable cycle.

In this way, it is possible to set a longer processing cycle of the loop filter means (702) and it is possible to relax the requirements for calculation speed. In addition, it is also possible to reduce power consumption.

Figure 10:
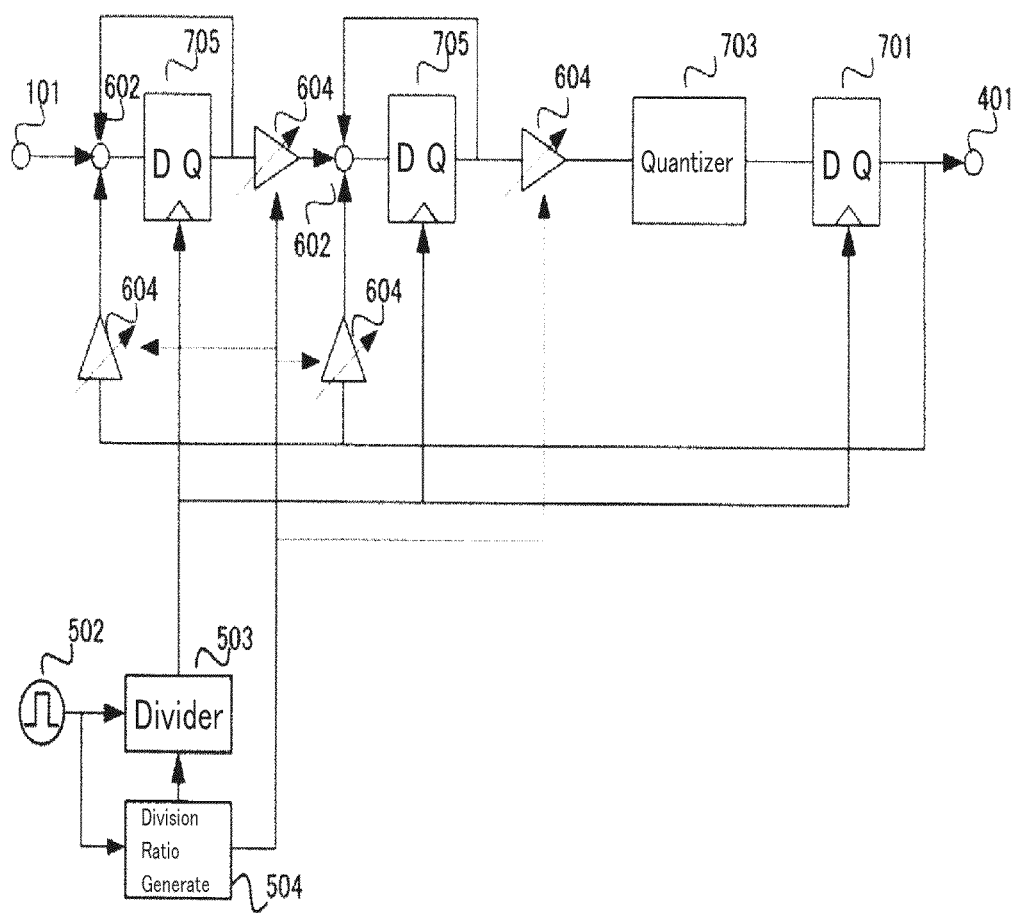
FIG. 10 is a structural diagram of a data converter related to an eighth embodiment of the present invention.

An eighth embodiment of the present invention is explained with reference to FIG. 10.

An integrator is formed from a flip-flop (705) and an adding means (602) and the output of the integrator is multiplied with a coefficient by a variable coefficient means (604). In the present embodiment, while the integrators are connected in series in two stages, it is possible to connect the integrators in three stages or more. The output of the integrator at the last stage is quantized by a quantization means (703) and sampled by the flip-flop (705).

In the present embodiment, both the flip-flop which forms an integrator and the flip-flop arranged after the quantizer are connected to a divider (503). The divider (503) divides a clock signal generation means (502) with a fixed cycle according to the division ratio of a division ratio generation means (504) and generates a variable cycle clock signal. Therefore, both of the flip-flops are driven by the variable cycle clock signals.

The coefficient of the variable coefficient means (604) is modified according to the division ratio generating means (504). In this way, it is possible to change the characteristics of a loop filter formed by the integrators in response to the variable cycle clock cycle from the divider (503) and to significantly reduce the deterioration of characteristics due to changes in a clock cycle.

Figure 11:
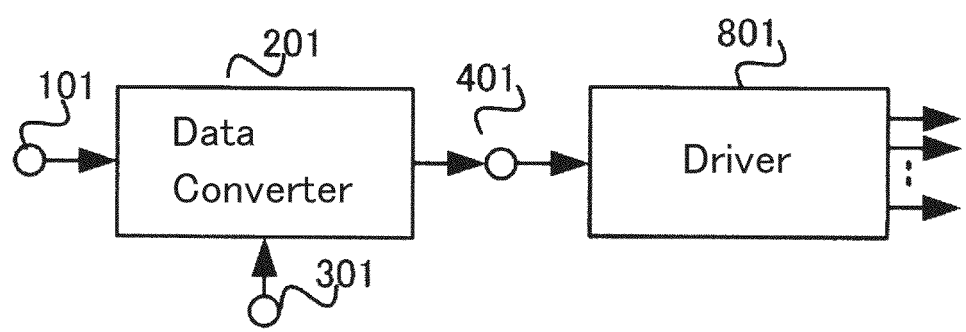
FIG. 11 is a structural diagram of a data converter related to a ninth embodiment of the present invention.

A ninth embodiment of the present invention is explained with reference to FIG. 11.

In the present embodiment, a driver means (801) is connected as a subsequent stage of a data converter of the first embodiment. Driver means (801) has a characteristic of being able to drive an actuator or the like connected to the driver means (801).

In the case of voltage driving, for example, a driver circuit with sufficiently low output impedance may be provided. In this way, it is possible to accurately convey a signal generated by the data converter means (201) to an actuator or the like and achieve high-precision conversion.

In addition, in the driver means in (801), it is possible to convert an input signal and output a thermometer code. By converting to a thermometer code, it is possible to reduce the variation in characteristics of the driver circuit and actuator.

Furthermore, in the driver means (801), it is also possible to convert an output an input signal to a 3 value code for driving each actuator driving in three states such as +1, 0, and −1. By converting to a 3 value code, when in low output power, it is possible to drive the actuator in 0, that is, not to drive the actuator, and a significant reduction in power consumption is possible.

In the present embodiment, while, the driver means (801) is connected to the data converting means (201), it is possible to connect the output of any of the embodiments described above and to improve performance.

Figure 12:
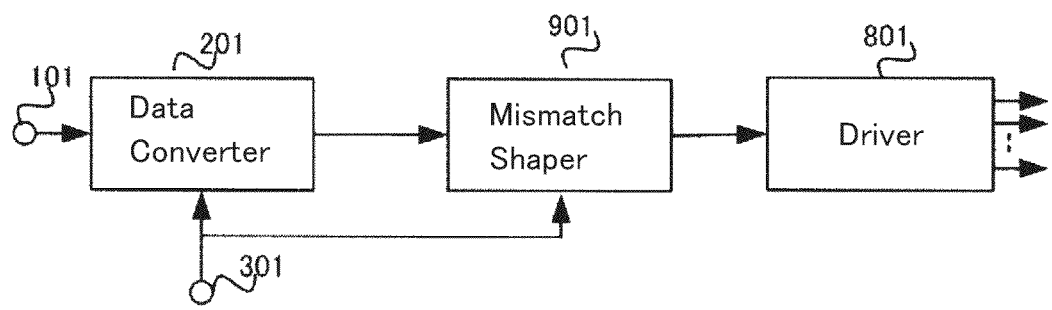
FIG. 12 is a structural diagram of a data converter related to a tenth embodiment of the present invention.

A tenth embodiment of the present invention is explained with reference to FIG. 12.

In the present embodiment, a mismatch shaper means (901) is inserted between a data conversion means (201) of the ninth embodiment and a driver means (801).

While in the ninth embodiment it becomes possible to reduce variations in the driver circuit and the actuator by converting an output to a thermometer code or a 3 value code, sufficient performance due to the deterioration of conversion accuracy can sometimes not be obtained. In the present embodiment, it is possible to reduce noise in the frequency characteristics using the mismatch shaper means (901) with respect to the influence of this variation.

Figure 13:
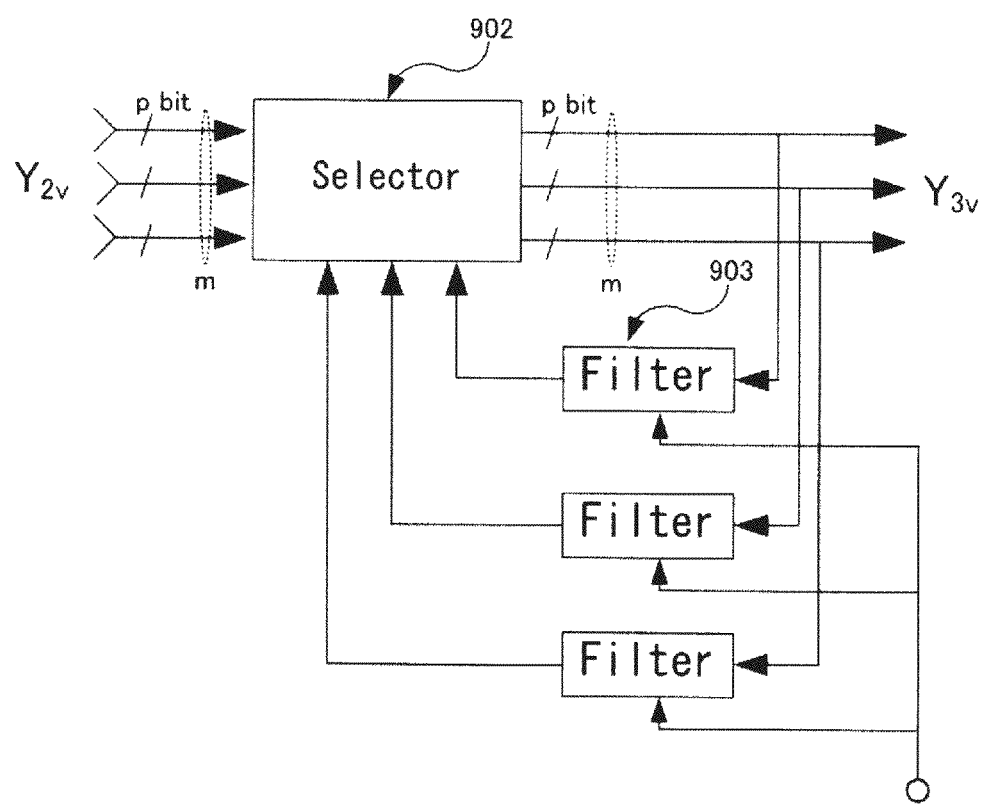
FIG. 13 is a diagram showing an example structure of a mismatching shaper used in a data converter related to a tenth embodiment of the present invention.

A configuration example of the mismatch shaper means (901) is shown in detail in FIG. 13.

The mismatch shaper means (901) is formed by a selection means (902) and a filter means (903) and selects the selection object such as an actuator according to the value specified by the input signal. In the case where the driver means (801) uses a 3 value code, a signal of one of the three states +1, 0, −1 to an actuator is output. This selection is carried out in accordance with the output of the filter means (903). The filter means is formed from a filter connecting integrators in cascade in general.

In addition, while the filter means is formed from a filter connecting integrators in cascade in general, it is possible to improve the properties by processing according to the cycle of the mismatch shaper means (901). By configuring the filter means (903) the same as a loop filter shown in the fifth to eighth embodiments, processing according to the output period becomes possible and mismatch shaping in consideration of the output time can be achieved.

Figure 14:
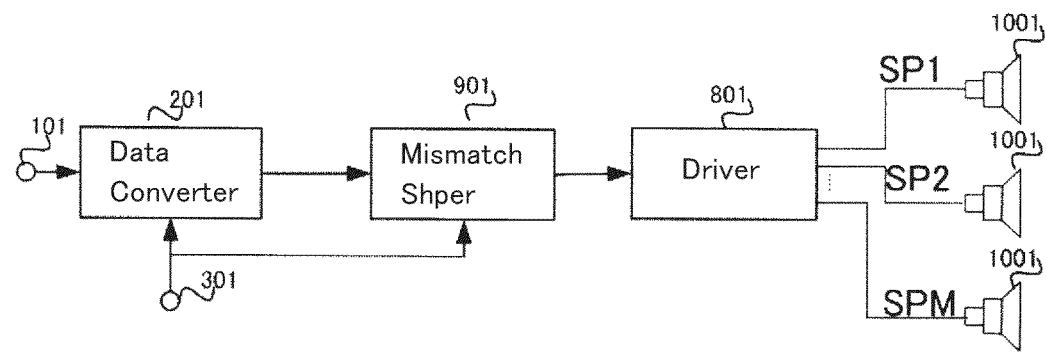
FIG. 14 is a structural diagram of a data converter related to an eleventh embodiment of the present invention.

An eleventh embodiment of the present invention is explained with reference to FIG. 14.

In the present embodiment, a speaker is used as an actuator. By such a configuration, it is possible to convert a digital signal directly to sound pressure with high precision.

In this way, it is possible to diffuse the spectrum of the output signal without degrading the accuracy of the output signal and to reduce the peak value of the spectrum at a particular frequency.

Figure 15:
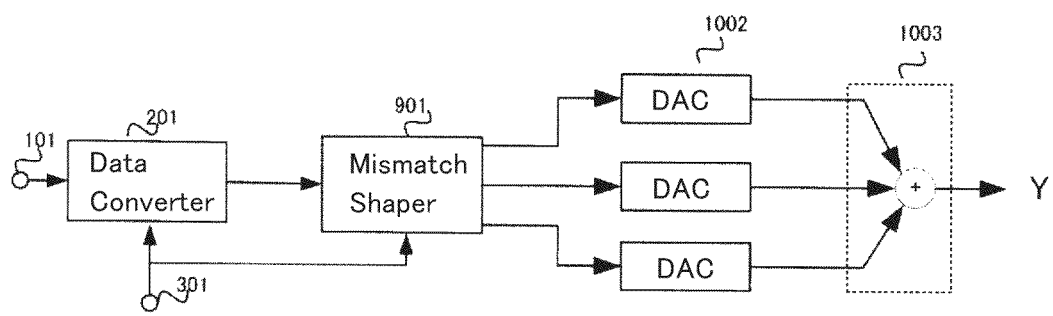
FIG. 15 is a structural diagram of a data converter related to a twelfth embodiment of the present invention.

A twelfth embodiment of the present invention is explained with reference to FIG. 15.

In the present embodiment, a digital-analog conversion means (1002) is used as an actuator. By such a configuration, it is possible to convert a digital signal to an analog signal with high precision.

In this way, it is possible to diffuse the spectrum of the output signal without degrading the accuracy of the output signal and to reduce the peak value of the spectrum at a particular frequency.

According to the present invention, it is possible to dynamically change a cycle of a clock signal used in a digital-analog converter, and to significantly reduce an internal signal of an analog-digital converter and a digital-analog converter, and an irradiated signal without degrading conversion accuracy while dispersing the spectrum. In this way, it is possible to use a clock signal with a higher frequency and achieve higher resolution with higher conversion accuracy.

What is claimed is:

1. A data converter comprising:
 a clock signal input part configured to input a clock signal;
 an input part configured to input an input signal;
 a sampling part configured to perform sampling of the input signal input to the input part in response to the clock signal input to the clock signal input part; and
 a signal processing part configured to perform signal processing according to a sampling cycle and outputs an output signal, and in case of the cycle of the clock signal input to the clock signal input part becoming longer, the output signal output by the signal processing part being reduced.

2. A data converter comprising:
 a clock signal input part configured to input a clock signal having a cycle which dynamically changes;
 an input part configured to input an input signal;
 a cycle detection part configured to detect a cycle of a clock signal input to the clock signal input part; and
 a signal processing part configured to perform signal processing of an input signal input to the input part according to a cycle of a clock signal detected by the cycle detection part and outputs an output signal.

3. The data converter according to claim 2, wherein the data converter diffuses a spectrum of an output signal and reduces a peak value of the spectrum at a specific frequency.

4. The data converter according to claim 2, wherein the clock signal input part includes a division ratio generator which dynamically changes a division ratio, and a divider which divides and inputs a clock signal according to a division ratio changed by the division ratio generator, wherein the cycle detection part detects a clock signal using the division ratio changed by the division ratio generator.

5. The data converter according to claim 3, wherein the clock signal input part includes a division ratio generator which dynamically changes a division ratio, and a divider which divides and inputs a clock signal according to a division ratio changed by the division ratio generator, wherein the cycle detection part detects a clock signal using the division ratio changed by the division ratio generator.

6. A data converter comprising:
 an input part configured to input an input signal:
 an integrator configured to integrate a signal output by the input part:
 a quantizer configured to quantize a signal output by the integrator: and
 a sampler configured to sample an output of the quantizer in response to a clock signal having a cycle which dynamically changes:
 wherein
 the input part includes a subtractor configured to perform subtracting process and outputting an output of the sampler from the input signal.

7. The data converter according to claim 6, wherein a cycle of a clock signal supplied to the integrator is smaller than a cycle of a clock signal in response to which the sampler samples an output of the quantizer.

8. The data converter according to claim 6, wherein a ratio of a cycle of a clock signal supplied to the integrator and a cycle of a clock signal in response to which the sampler samples an output of the quantizer is an integer ratio.

9. The data converter according to claim 7, wherein a ratio of a cycle of a clock signal supplied to the integrator and a cycle of a clock signal in response to which the sampler samples an output of the quantizer is an integer ratio.

10. A data converter comprising:
an input part configured to input an input signal:
a loop filter configured to input a signal output by the input part:
a quantizer configured to quantize a signal output by the loop filter; and
a sampler configured to sample an output of the quantizer in response to a clock signal having a cycle which dynamically changes;
wherein
the input part includes a subtractor configured to perform subtracting process and outputting an output of the sampler from an input signal and performing outputting.

11. The data converter according to claim 10, wherein the loop filter is a resonator.

12. The data converter according to claim 10, wherein the loop filter detects a cycle of a clock signal supplied to the loop filter and changes a coefficient of the loop filter.

13. The data converter according to claim 12, further comprising:
a division ratio generator configured to dynamically change a division ratio; and
a divider configured to divide and inputting a clock signal according to the division ratio changed by the division ratio generator;
wherein
a clock signal by which the sampler samples an output of the quantizer is an output signal of the divider; and
an output signal of the divider is supplied to the loop filter.

14. A data converter comprising:
a clock signal input part configured to input a clock signal;
an input part configured to input an input signal;
a sampling part configured to perform a sampling of an input signal input to the input part in response to a clock signal input to the clock signal input part:
a signal processing part configured to perform signal processing according to a cycle of the sampling and outputs an output signal; and
a driver configured to drive an actuator according to an output signal output by the signal processing part;
wherein
when a cycle of a clock signal input to the clock signal input part becomes longer, an output signal output by the signal processing part is smaller.

15. The data converter according to claim 14, wherein the driver outputs a 3 value code and drives the actuator.

16. The data converter according to claim 14, further comprising a miss match shaper inputting an output signal output by the signal processing part and outputs a signal to the driver.

17. The data converter according to claim 15, further comprising a miss match shaper inputting an output signal output by the signal processing part and outputs a signal to the driver.

18. The data converter according to any one of claim 14, wherein the actuator is a speaker.

19. The data converter according to any one of claim 15, wherein the actuator is a speaker.

20. The data converter according to any one of claim 16, wherein the actuator is a speaker.

* * * * *